United States Patent

Rokugawa

[11] Patent Number: 5,848,084
[45] Date of Patent: Dec. 8, 1998

[54] SEMICONDUCTOR LIGHT SOURCE FOR AN OPTICAL TRANSMITTER AND AN OPTICAL TRANSMISSION MODULE USING THE SEMICONDUCTOR LIGHT SOURCE

[75] Inventor: Hiroyuki Rokugawa, Kawasaki, Japan

[73] Assignee: Fujitsu Limited, Kawasaki, Japan

[21] Appl. No.: 701,794

[22] Filed: Aug. 26, 1996

[30] Foreign Application Priority Data

Aug. 25, 1995 [JP] Japan ..................................... 7-216929

[51] Int. Cl.⁶ ....................................................... H01S 3/19
[52] U.S. Cl. ................... 372/38; 372/50; 372/26; 372/29; 257/81; 385/88; 385/92
[58] Field of Search ................. 372/26, 29, 38, 372/46, 50; 385/88, 92, 93, 94; 257/81, 91, 99; 350/96.15

[56] References Cited

U.S. PATENT DOCUMENTS

| | | | |
|---|---|---|---|
| 4,918,701 | 4/1990 | Amann et al. | 372/50 |
| 4,993,798 | 2/1991 | Thylen | 350/96.15 |
| 5,056,100 | 10/1991 | Vahala et al. | 372/26 |
| 5,265,111 | 11/1993 | Chesnoy et al. | 372/29 |
| 5,337,323 | 8/1994 | Rokugawa et al. | 372/31 |
| 5,473,323 | 12/1995 | Rokugawa | 375/324 |
| 5,526,455 | 6/1996 | Akita et al. | 385/93 |
| 5,537,504 | 7/1996 | Cina et al. | 385/93 |
| 5,572,615 | 11/1996 | Emori | 385/92 |
| 5,586,207 | 12/1996 | Goodwin | 385/94 |

FOREIGN PATENT DOCUMENTS

| | | |
|---|---|---|
| 55-133587 | 10/1980 | Japan . |
| 56-046588 | 4/1981 | Japan . |
| 62-281489 | 12/1987 | Japan . |
| 1-179480 | 7/1989 | Japan . |
| 3-147387 | 6/1991 | Japan . |
| 4-216685 | 8/1992 | Japan . |
| 4-233289 | 8/1992 | Japan . |
| 5-075200 | 3/1993 | Japan . |
| 6-275916 | 9/1994 | Japan . |

*Primary Examiner*—Rodney Bovernick
*Assistant Examiner*—Yisun Song
*Attorney, Agent, or Firm*—Staas & Halsey

[57] ABSTRACT

A semiconductor light source for an optical transmitter which includes at least one DC supply unit and at least one AC supply unit, comprises a DC signal source connected to the DC supply unit in order to supply a drive signal thereto; and an AC signal source connected to the AC supply unit in order to supply a control signal thereto; wherein turning on or off an optical output by the semiconductor light source is controlled by using a control signal having the same electric polarity as the drive signal.

1 Claim, 7 Drawing Sheets

SEMICONDUCTOR LIGHT SOURCE FOR AN OPTICAL TRANSMITTER AND AN OPTICAL TRANSMISSION MODULE USING THE SEMICONDUCTOR LIGHT SOURCE

BACKGROUND OF THE INVENTION

1. Field of the Invention

The present invention relates to a semiconductor light source for an optical transmitter and an optical transmission module using the above semiconductor light source.

2. Description of the Related Art

An optical transmission technique has been widely applied to a main transmission line enabling long distance communication. On the other hand, recently, with the development of an optical communication technique, the optical transmission technique has been applied to a short distance optical communication, for example, between optical terminals, between optical exchangers, between computers, and the like. Further, this technique has been applied to wiring of the optical fiber within an optical terminal, within an optical exchanger, and within computer by utilizing the high speed and broadband characteristics of optical transmission.

In the optical transmission technique for the short distance optical communication, it is required to provide hardware having a low power consumption and small size.

On the other hand, conventionally, an interface between electronic devices for transmitting an electric signal has been usually performed by using ECL (Emitter Coupled Logic) technology. Further, since a high speed CMOS (Complementary Metal Oxide Semiconductor) technology has been realized with development of the electronic device manufacturing techniques, the interface can be realized with high speed and low power consumption by using the CMOS.

Further, a power source also has been changed with the change of the interface mentioned above. For example, conventionally, a power source having a negative polarity corresponding to the levels of ECL has been utilized, or a power source mixing a negative polarity with a positive polarity has been utilized for mixing a high speed interface with a relatively low speed interface, for example, a TTL (transistor transistor logic).

Still further, a power source having only positive polarity and one kind of voltage has been utilized. Still further, a low voltage is required for a power source in order to realize a low power consumption.

In the interface as mentioned above, it is required to realize an apparatus having a low power consumption in the optical transmission/reception system. Conventionally, there are provided a light emitting diode (LED) and a laser diode (LD) as an actual light emitting element. In this case, it is preferable to utilize a semiconductor laser as a semiconductor light source from the viewpoints of high speed and high output.

SUMMARY OF THE INVENTION

The object of the present invention is to provide a semiconductor light source for an optical transmitter and an optical transmission module using the semiconductor light source, which can realize a power source having a positive polarity and low power voltage with high speed modulation.

In accordance with the present invention, there is provided a semiconductor light source for an optical transmitter including at least one direct current (DC) supply unit and at least one alternating current (AC) supply unit, including: a DC signal source connected to the DC supply unit for supplying a drive signal thereto; and an AC signal source connected to the AC supply unit for supplying a control signal thereto; wherein turning on/off of an optical output from the semiconductor light source is controlled by using the control signal having the same electric polarity as the drive signal.

In a preferred embodiment, the semiconductor light source is formed by a semiconductor laser.

In another preferred embodiment, the drive signal from the DC signal source to the DC supply unit is formed by a DC current.

In still another preferred embodiment, the control signal from the AC signal source to the AC supply unit is formed by a current modulation signal.

In still another preferred embodiment, the control signal from the AC signal source to the AC supply unit is formed by a voltage modulation signal.

In still another preferred embodiment, the optical output from the semiconductor light source has a threshold characteristic or a bistable characteristic for the current modulation signal or the voltage modulation signal.

In still another preferred embodiment, a voltage level of the voltage modulation signal at a turning-on of the optical output does not exceed a leading potential in a current-to-voltage characteristic of the semiconductor laser.

In still another preferred embodiment, the semiconductor laser is formed by a two-electrode semiconductor laser.

In still another preferred embodiment, the two-electrode semiconductor laser is provided on an n-type substrate which is set to a common potential to a reference potential of a power source of the DC/AC signal source, and a polarity of the power source of the DC/AC signal source is set to a positive state for the common potential.

In still another preferred embodiment, a DC signal supply electrode is positioned opposite to an AC signal supply electrode as to an optical axis.

In still another preferred embodiment, an insulating substrate is provided corresponding to the two-electrode semiconductor laser; the DC signal supply electrode is directly coupled to a DC signal supply pad provided on the insulating substrate; and the AC signal supply electrode is directly coupled to an AC signal supply pad provided on the insulating substrate; wherein the DC signal is applied to the DC signal supply pad through a DC signal transmission line provided on the insulating substrate, and the AC signal is applied to the AC signal supply pad through an AC signal transmission line provided on the insulating substrate.

In still another preferred embodiment, an optical fiber is directly coupled to the semiconductor light source.

In still another preferred embodiment, an optical transmission module includes:

the semiconductor light source; an optical coupling unit included inside an inner optical fiber directly connected to the semiconductor light source and mounted on the same substrate as the semiconductor light source; a butting contact unit included inside the inner optical fiber elongated from the optical coupling unit; and a body containing the semiconductor light source, the optical coupling unit and the butting contact unit, so as to form an air-sealed portion therein; wherein; when an optical connector included inside an outer optical fiber, which is used as an optical transmission line, is inserted to an adaptor mounted to the butting contact unit, an end surface of the butting contact unit is butted to an end surface of the optical connector so that the inner optical fiber and the outer optical fiber are directly connected each other; thereby, an optical output emitted from the semiconductor light source is transmitted to the outer optical fiber through the inner optical fiber, the end surface of the butting contact means, and the end surface of the optical connector.

In still another preferred embodiment, the body further contains an electronic circuit for driving the semiconductor light source.

DESCRIPTION OF THE PREFERRED EMBODIMENTS

Before describing the preferred embodiments, a conventional art and its problem will be explained in detail hereinafter.

Figure 1:
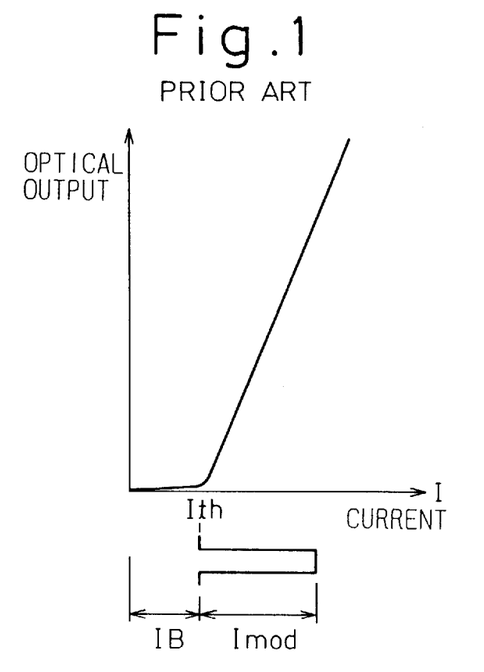
FIG. 1 is an explanatory view for explaining a conventional drive method of a semiconductor laser.

FIG. 1 is an explanatory view for explaining a conventional drive method of a semiconductor laser. In FIG. 1, the ordinate shows an intensity of an optical output, and the abscissa shows current flowing through the semiconductor laser. As shown in FIG. 1, when the current increases gradually, the intensity of the optical output increases slightly. Further, when the current exceeds a particular value shown by "Ith", the optical output of the semiconductor laser considerably increases, and the semiconductor laser starts laser oscillation. In general, this particular value Ith is called "oscillation threshold current".

In above mentioned drive method, the current flowing through the semiconductor laser is divided into two components, i.e., bias current component IB which appears to be direct current (DC) component and modulation current component Imod. In the conventional drive method, since the bias current component IB is set to the vicinity of the particular value Ith, either the large optical output or the small optical output is generated in accordance with the modulation current. That is, when the modulation current is smaller than the particular value Ith, the optical output becomes small. When the modulation current is larger than the particular value Ith, the optical output becomes large. In general, the large optical output is used as a digital signal "1", and the small optical output is used as the digital "0".

In the above drive method, however, it is necessary to provide both large modulation current and small modulation current for generating the large optical output and the small optical output.

On the other hand, in general, it is very difficult to generate a large current (several tens of mA) having a high frequency in an electronic circuit when a power voltage is low. Particularly, in the semiconductor laser, there is a proper voltage potential which is needed to pass the current through a diode as a proper characteristic thereof. The proper voltage potential is approximately 1 (v) in the semiconductor laser used in the optical communication system.

Accordingly, when the power voltage is 3.3 (v), it is very difficult to obtain the current of several ten mA having high frequency. Further, there is another problem in a circuit arrangement having a differential type which is used for high speed modulation of the semiconductor laser.

Figure 2:
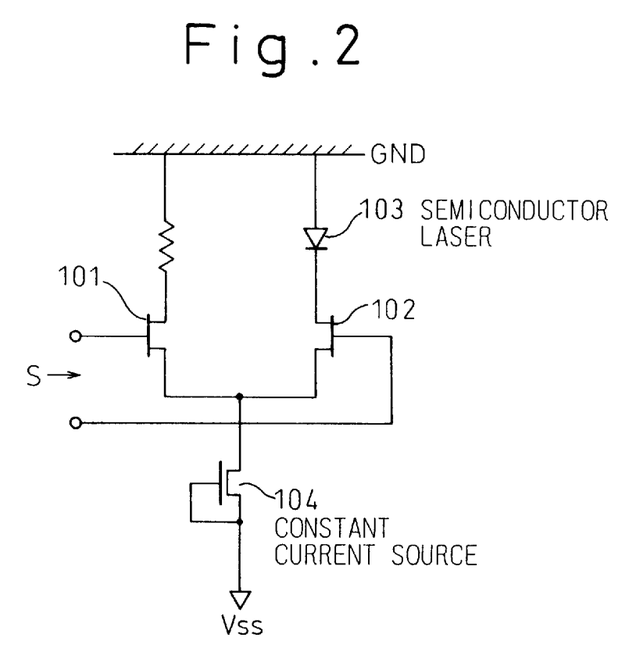
FIG. 2 is a basic drive circuit of a semiconductor laser having a differential type.

FIG. 2 is a basic drive circuit of the semiconductor laser having the differential type. Reference numbers 101 and 102 denote FETs (Field Effect Transistors) which form the differential type. Reference number 103 denotes a semiconductor laser, and 104 denotes a constant current source. Further, reference letter S denotes a control signal.

Still further, GND denotes a first voltage source, and Vss denotes a second voltage source. In general, the GND is set to a ground potential and Vss is set to a negative potential. Accordingly, the first voltage source GND is higher than the second voltage source Vss. This is because the potential of the both transistors is set to a common potential by using the ground potential (low potential side) in order to avoid unstable operation caused by fluctuation of potential. That is, if the potential of both transistors is not common, the operation of the semiconductor laser becomes unstable caused by fluctuation of potential of the power source.

As shown in FIG. 2, a semiconductor laser is connected to one of transistors 101 and 102. In this case, the semiconductor laser 103 is connected to the transistor 102. The current flowing through the transistors 101 and 102 are switched in response to the control signal S. When the transistor 102 is turned on, the current flows from the first voltage source GND to the second voltage source Vss through the semiconductor laser 103 and the constant current source 104.

In the structure shown in FIG. 2, if the power source is changed to a positive potential (i.e., the Vss is set to the positive potential, and the GND is set to the negative potential), it is very difficult to maintain the same output characteristic as the previous state (i.e., before change to the positive potential) since it is impossible to set a high potential side of the FET to the common potential.

Still further, recently, a new semiconductor light source has been proposed in order to solve the difficulty of high speed modulation when modulating the optical output of the semiconductor laser by using current. This optical light source is formed by a semiconductor laser and an optical modulator of a field absorption type (below, field absorption type optical modulator), and these are integrated on the same substrate.

Figure 3A:
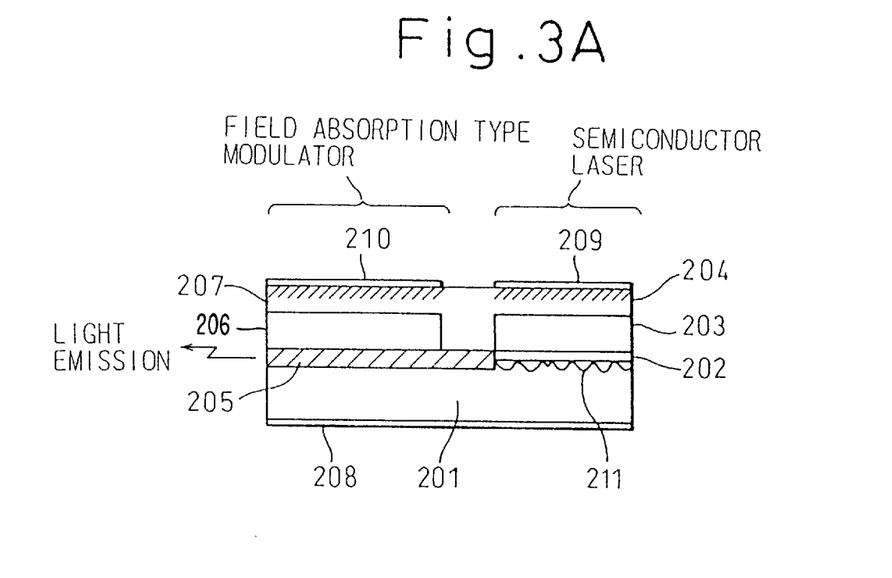
FIG. 3A is a sectional view of a light source element which integrates the semiconductor laser and a field absorption type optical modulator.
Figure 3B:
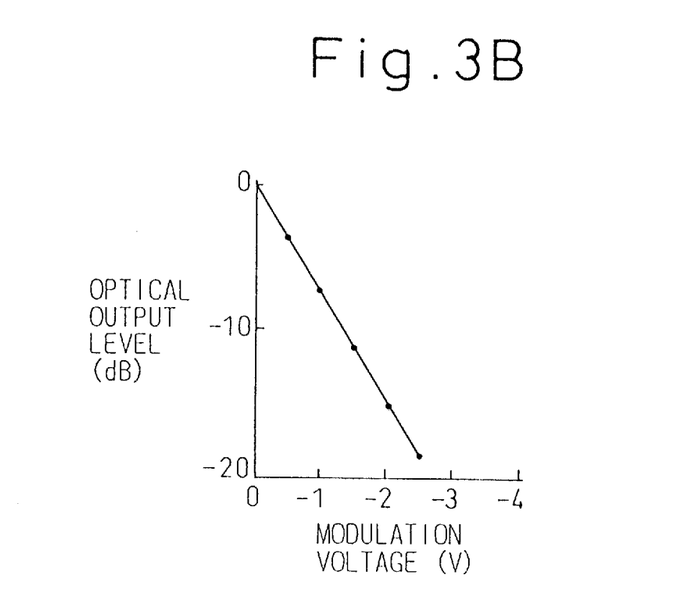
FIG. 3B is a graph for explaining a modulation characteristic of FIG. 3A.

FIG. 3A is a sectional view of a light source element which is formed by integrating the semiconductor laser and the field absorption type optical modulator, and FIG. 3B is a graph for explaining a modulation characteristic of FIG. 3A.

In FIG. 3A, reference number 201 denotes an n-type substrate, 202 an activation layer, 203 a p-type layer, 204 and 207 insulation layers each doped by zinc (Zn), 205 an absorption layer, 206 a p-type layer, 208 an n-type electrode, 209 and 210 p-type electrodes, and 211 a λ/4 diffraction grating used for a single wavelength light emission.

The semiconductor laser is formed by the activation layer 202, the p-type layer 203 and the insulation layer doped by the zinc 204. On the other hand, the field absorption type optical modulator is formed by the absorption layer 205, the p-type layer 206 and the insulation layer doped by the zinc 207. The semiconductor laser and the field absorption type optical modulator are formed on the same n-type substrate 201. Slant lines in the insulation layers 204 and 207 denote a conductive portion.

The direct current (DC) is applied from the positive source to the p-type electrode 209 and flows to the n-type electrode 208 which is provided on the n-type substrate 201 so that the light is emitted from the semiconductor laser. Further, the negative potential is applied to the p-type electrode 210 on the modulator as the modulation signal. When the negative potential is applied to the p-type electrode 210, an absorption factor of the absorption layer 205 is changed so that it is possible to change the intensity of the optical output.

In FIG. 3B, the ordinate shows the optical output level (dB) and the abscissa shows the modulation voltage. As is obvious, it is possible to turn on/off the optical output by changing the modulation voltage (v).

On the structure of the semiconductor light source in FIG. 3A, the direct current component and the modulation component are set to the potential having an opposite polarity to each other on the n-type electrode 208. Accordingly, since it is necessary to provide at least two kinds of power sources, i.e., the positive voltage source and the negative voltage source, the structure of FIG. 3A is inadequate to reduce the power source.

As explained above, in the method for driving the semiconductor laser as the semiconductor light source, it is very difficult to realize a power source having both the positive voltage and low voltage with high speed modulation.

In the drive method of the semiconductor light source which forms the optical transmitter, the present invention aims to provide the semiconductor light source used for the optical transmitter and the optical transmission module which can realize the power source having both the positive voltage and low voltage with high speed modulation.

Figure 4:
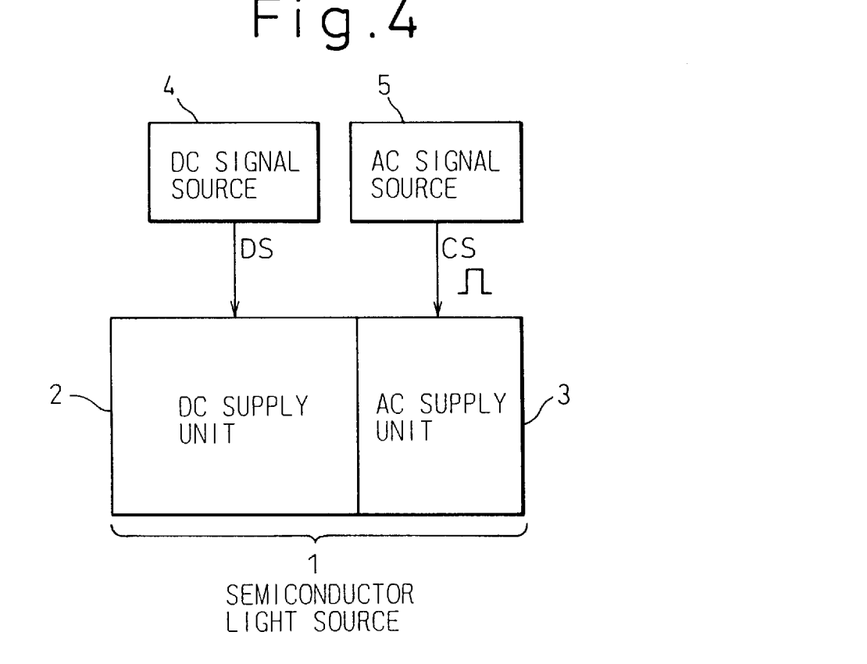
FIG. 4 is a basic structural view of a semiconductor light source according to the present invention.

FIG. 4 is a basic structural view of a semiconductor light source according to the present invention. In FIG. 4, reference number 1 denotes a semiconductor light source, the number 2 denotes a direct current (DC) supply unit, the number 3 denotes an alternating current (AC) supply unit, the number 4 denotes a direct current (DC) signal source, and the number 5 denotes an alternating current (AC) signal source.

The semiconductor light source 1 is a light emission element for an optical transmitter and includes at least one DC supply unit 2 and AC supply unit 3. The DC signal source 4 is connected to the DC supply unit 2 and supplies a drive signal DS (DC signal) thereto. The AC signal source 5 is connected to the AC supply unit 3 and supplies a control signal CS (AC signal) having the same electric polarity as the drive signal DS so that turning on/off of the optical output from the semiconductor light source 1 is controlled. In this case, the AC signal is a pulsating signal which includes a DC component as a bias.

In a preferred embodiment, the semiconductor light source 1 is formed by a semiconductor laser.

In another preferred embodiment, the drive signal DS from the DC signal source 4 to the DC supply unit 2 is formed by a DC current.

In still another preferred embodiment, the control signal CS from the AC signal source 5 to the AC supply unit 3 is formed by either a current modulation signal or a voltage modulation signal.

In still another preferred embodiment, the optical output from the semiconductor laser has a threshold characteristic or a bistable characteristic for the current modulation signal or the voltage modulation signal.

In still another preferred embodiment, the voltage level of the voltage modulation signal at a turning on of the optical output does not exceed a leading potential of the semiconductor laser at the current-to-voltage characteristic.

Figure 5:
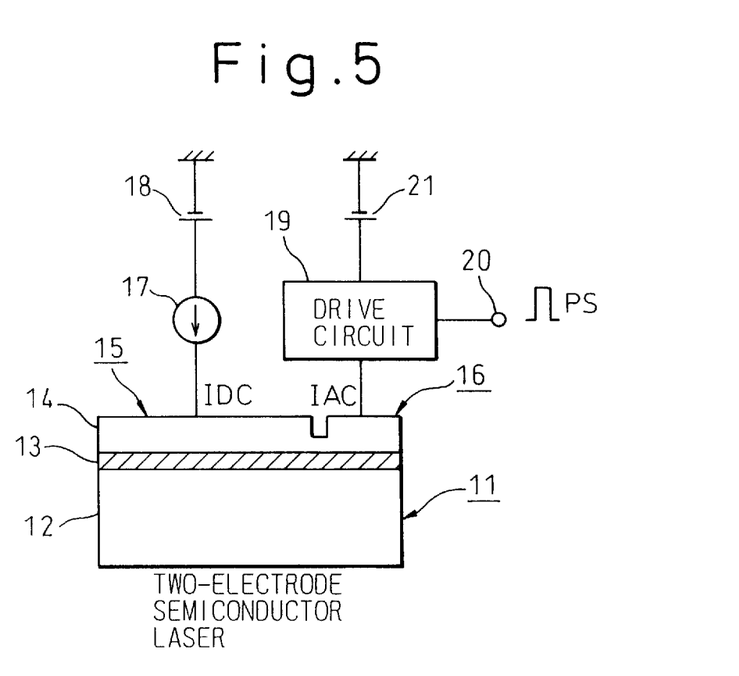
FIG. 5 is a basic structural view of the semiconductor light source according to a first embodiment of the present invention.

FIG. 5 is a basic structural view of a semiconductor light source according to a first embodiment of the present invention.

In FIG. 5, reference number 11 denotes a semiconductor laser having two electrodes, 12 an n-type substrate, 13 an activation layer, 14 a p-type layer, 15 a DC supply unit, 16 an AC supply unit, 17 a current source, 18 a DC source, 19 a drive circuit, 20 a drive signal terminal, and 21 a DC current source.

The semiconductor light source 1 is formed by a semiconductor laser 11 having two electrodes (below, two-electrode semiconductor laser). The two-electrode semiconductor laser 11 is formed by the n-type substrate 12, the activation layer 13 and the p-type layer 14. The n-type substrate 12 is set to a reference potential and common potential for the DC signal source 4 and the AC signal source 5. Further, the polarity of the power source of the DC signal source 4 and the AC signal source 5 is set to a positive state for the common potential.

The DC source 18 is connected to the DC supply unit 15 through the current source 17. Further, the DC source 21 is connected to the drive circuit 19 which generates the AC signal. The pulsating signal PS is input to the drive circuit 19 through the terminal 20.

There are many kinds of the electrical-to-optical output characteristics of the two-electrode semiconductor laser in accordance with the length of the electrodes of the DC supply unit and the AC supply unit.

Figure 6:
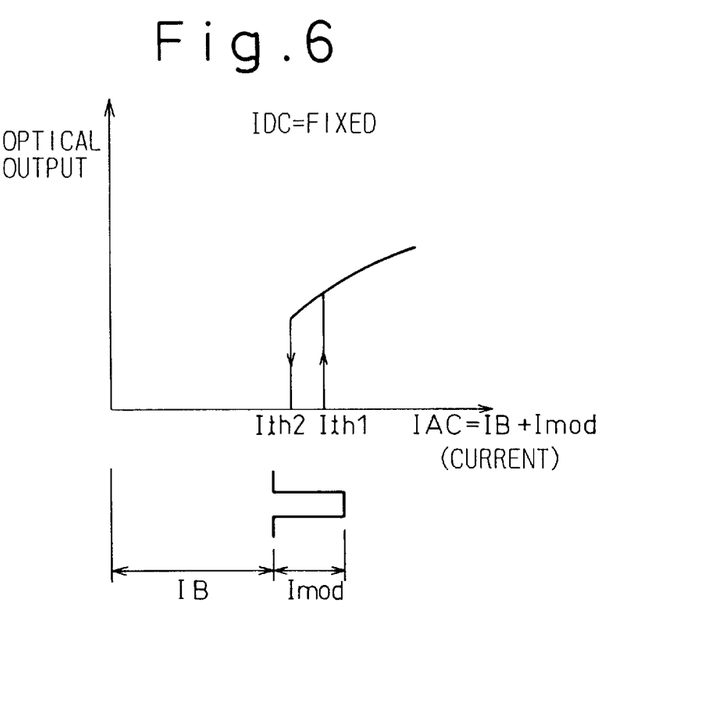
FIG. 6 shows one example an electrical-to-optical characteristic of a two-electrode semiconductor laser.

FIG. 6 shows one example an electrical-to-optical characteristic of the two-electrode semiconductor laser. The ordinate denotes an optical output, and the abscissa denotes a current. As shown by arrows, the optical output has a bistable characteristic (or a hysteresis characteristic). This characteristic can be obtained by supplying a fixed current IDC to the DC supply unit 15 and changing the AC current IAC which supplys the AC supply unit 16 in FIG. 5. When the current I increases and exceeds the first threshold value Ith1, the semiconductor laser starts laser oscillation. When the current decreases and reaches to the second threshold value Ith2, the semiconductor laser stops the laser oscillation.

In the two-electrode semiconductor laser, the hysteresis characteristic is dependent on the length of the electrodes of the DC supply unit 15 and the AC supply unit 16. Accordingly, it is possible to design the semiconductor laser so as to rapidly oscillate when the current reaches a particular threshold value without the hysteresis characteristic. However, both the case that the oscillation depends on the hysteresis and the case that the oscillation depends on the particular threshold value are handled as the same laser oscillation in order to simpify the following explanation.

In FIG. 6, the current IAC flowing in the AC supply unit 16 is divided into the bias current IB and the modulation current Imod. The bias current IB is set to a value smaller than the second threshold value Ith2, and the bias current IB plus the modulation current Imod (IB+Imod) is set to a value larger than the first threshold value Ith1. When setting the current as mentioned above, the two-electrode semiconductor laser 11 repeats between oscillation state and non-oscillation state in accordance with a change in the modulation current Imod.

In the two-electrode semiconductor laser, according to the present invention, only several mA of modulation current is sufficient to perform the laser oscillation although 30 mA of current is required in the conventional art.

This is because it is possible to design a width of hysteresis so as to be several mA of the modulation current. Further, by preferably designing the length of the electrode of the two-electrode semiconductor laser, it is possible to perform the modulation based on only the voltage signal without the current flowing to the AC supply unit 16 (in this case, very little current flows in the AC supply unit 16) as explained below.

Figure 7:
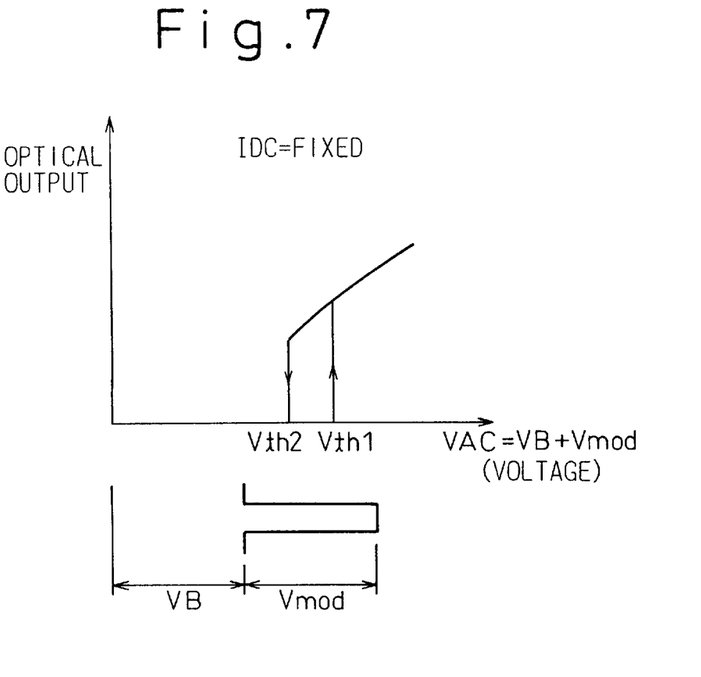
FIG. 7 shows another example an electrical-to-optical characteristic of the two-electrode semiconductor laser.

FIG. 7 shows another example an electrical-to-optical characteristic of the two-electrode semiconductor laser. The ordinate denotes an optical output, and the abscissa denotes a voltage. As shown by arrows, the optical output has the hysteresis characteristic as in FIG. 6.

In FIG. 7, the voltage VAC supplied to the AC supply unit 16 is divided into the bias voltage VB and the modulation voltage Vmod. The bias voltage VB is set to a value smaller than the second threshold value Vth2, and the bias voltage VB plus the modulation voltage Vmod (VB+Vmod) is set to a value larger than the first threshold value Vth1.

In this example, it is possible to set an amplitude of the voltage signal to very small value, for example, below 1 (v). Since the amplitude can set to a very small value, the circuit design becomes easier than the design of a high frequency current modulation circuit.

The reason, which the voltage is below 1 (v), is that a predetermined small voltage is necessary for passing the current based on a diode characteristic.

Figure 8:
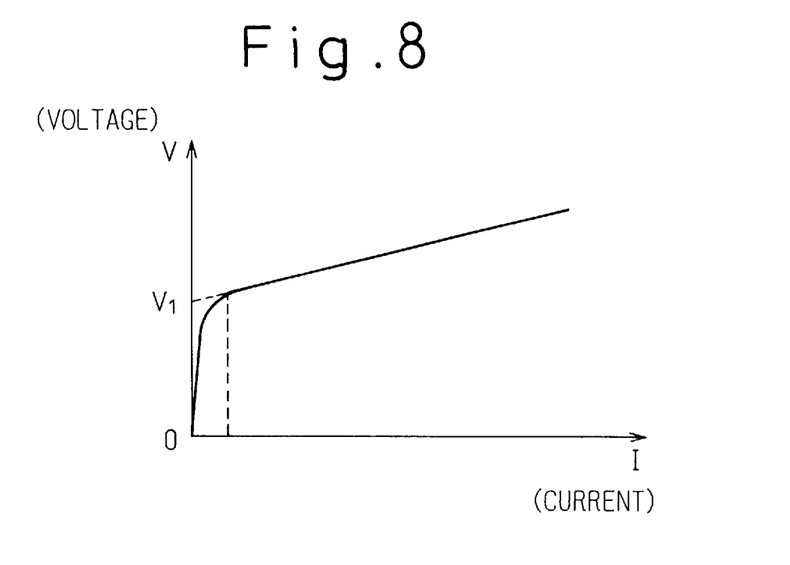
FIG. 8 is a graph for explaining a voltage-to-current characteristic of the semiconductor laser.

FIG. 8 is a graph for explaining a voltage-to-current characteristic of the semiconductor laser. The ordinate denotes a voltage, and the abscissa denotes a current. When the voltage which is applied to the semiconductor laser exceeds a predetermined value V1, a current flows through the semiconductor laser. Accordingly, in order to control the turning on/off of the semiconductor laser by using the voltage without the current, it is necessary to set the voltage below the value V1.

As explained above, for example, using the two-electrode semiconductor, by separating the DC signal and the AC signal and supplying them to the semiconductor laser, it is possible to modulate the semiconductor light source by using a modulation signal having very small current or voltage.

In this case, for example, when the semiconductor light source is formed by the two-electrode semiconductor laser shown in FIG. 5, the DC signal and the AC signal have the same polarity. Further, when the two-electrode semiconductor is formed on the n-type substrate and the substrate potential is set to a common potential or ground potential, the potential of the signal supply side becomes positive.

The problem of the high speed modulation circuit occurs at a time when using large current for a high speed modulation signal. Since the modulation can be performed using a relatively small signal by using the semiconductor light source according to the present invention, it is possible to easily realize the high speed modulation circuit when using the power source having the positive polarity.

Further, particularly, when performing the modulation by using the voltage signal, it is possible to use a circuit having a DCFL (direct coupled FET logic) type as the drive circuit which can obtain the signal having the amplitude of about 1 (v) by using a low power voltage.

Figure 9:
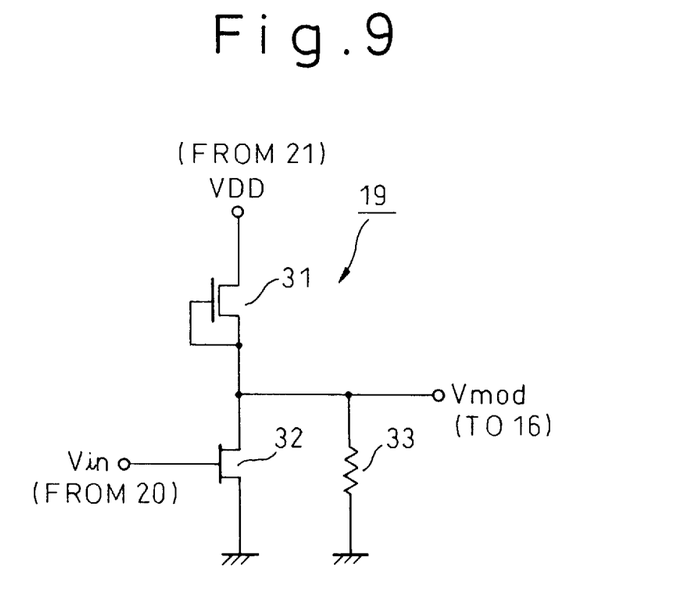
FIG. 9 shows one example of a drive circuit having a DCFL type circuit.

FIG. 9 shows one example of a drive circuit 19 having the DCFL type circuit. The transistor (FET) 32 is connected between the positive power source VDD and the ground GND through the current source 31. When the modulation data Vin which is formed by a binary signal is supplied from the drive signal terminal 20 to a gate of the FET 32, it is possible to obtain the modulation voltage Vmod in one end of a load resistor 33. The modulation voltage Vmod is sent to the AC supply unit 16.

Figure 10:
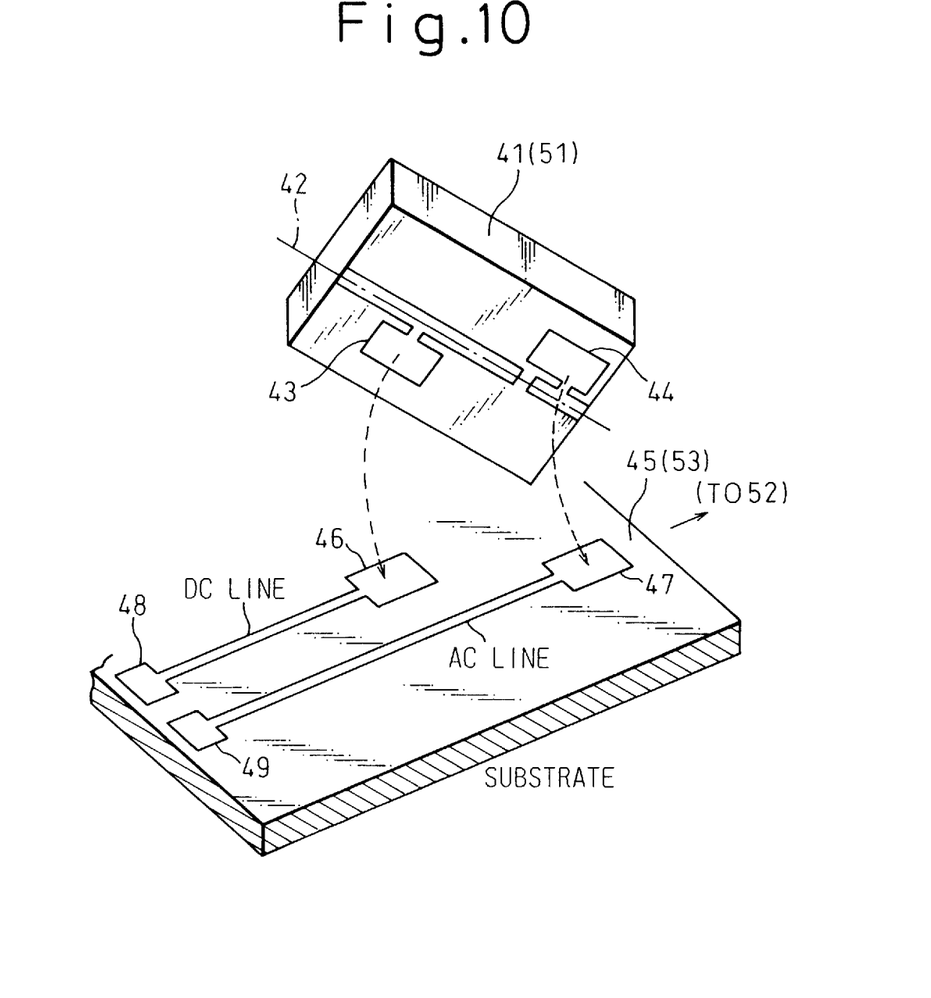
FIG. 10 shows a second embodiment of the present invention.

FIG. 10 shows a second embodiment of the present invention. This drawing shows an optical transmitter using a semiconductor laser according to the present invention.

In FIG. 10, reference number 41 denotes a two-electrode semiconductor laser, 42 an optical axis, 43 a DC signal supply electrode, 44 an AC signal supply electrode, 45 an insulating substrate, 46 a DC signal supply pad, 47 an AC signal supply pad, 48 a DC signal transmission line, and 49 an AC signal transmission line.

In the two-electrode semiconductor laser 41, the DC signal supply electrodes 43 are located opposite to the AC supply electrode 44 with respect to an optical axis 42. According to this structure, it is possible to easily provide the electrodes without any difficulty in signal wiring.

The semiconductor laser 41 is provided on the insulating substrate 45 which includes the DC signal supply pad 46, the AC signal supply pad 47, the DC signal transmission line 48 and the AC signal transmission line 49. The DC signal supply pad 46 is connected to the DC signal transmission line 48 on the insulating substrate 45. Further, the AC signal supply pad 47 is connected to the AC signal transmission line 49.

The DC signal supply electrode 43 is directly coupled to the DC signal supply pad 46, and the AC signal supply electrode 44 is directly coupled to the AC signal supply pad 47 by using, for example, flip-chip bonding. Accordingly, it is possible to simultaneously realize an electrical connection and a mechanical connection between the DC electrode 43 and the DC pad 46, and between the AC electrode 44 and the AC pad 47. As a result, the DC signal is supplied to the DC signal supply electrode 43 through the DC signal transmission line 48 and the DC signal supply pad 46, and the AC signal is supplied to the AC signal supply electrode 44 through the AC signal transmission line 49 and the AC signal supply pad 47.

The DC signal supply pad 46 and the AC signal supply pad 47 can be connected to an optional position on the insulating substrate 45 by using the DC signal transmission line 48 and the AC signal transmission line 49. As a result, it is possible to solve a problem, which is caused by an increase in the number of electrodes compared to a general semiconductor laser, on an actual mounting technique of the semiconductor light source. Further, the optical fiber is directly coupled to the semiconductor light source so as to form the optical transmission module.

Figure 11A:
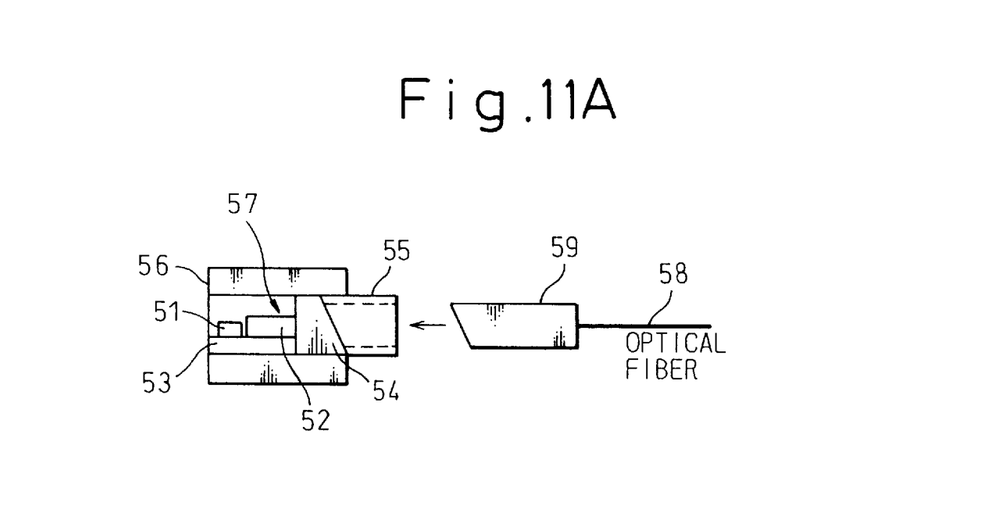
FIGS. 11A and 11B show a third embodiment of the present invention.
Figure 11B:
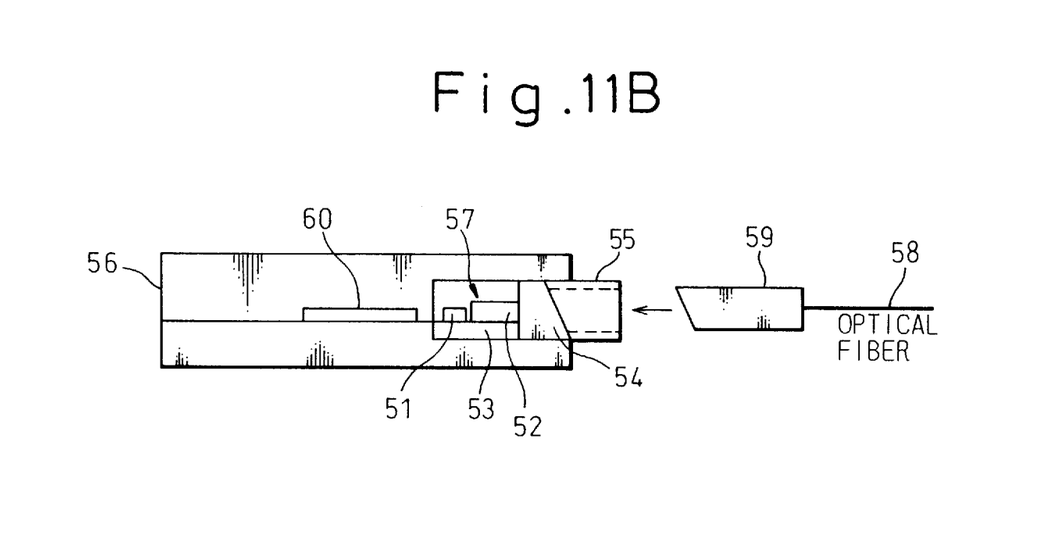

FIGS. 11A and 11B show a third embodiment of the present invention. These drawings show a basic structure of an optical transmission module including a semiconductor light source according to the present invention. In FIG. 11A, the optical transmission module includes mainly the semiconductor light source. In FIG. 11B, the optical transmission module includes the semiconductor light source and an electronic circuit. The structural feature of the optical transmission module lies in a direct connection to an optical fiber through an optical connector as explained below.

In FIGS. 11A and 11B, reference number 51 denotes a semiconductor light source, the number 52 denotes an optical coupling unit which includes the optical fiber coupled to the semiconductor light source, the number 53 denotes a substrate for mounting the semiconductor light source 51 and the optical coupling unit, the number 54 denotes a butting contact unit which includes the optical fiber directly connected to another optical fiber, the number 55 denotes an adapter coupled with an optical connector, and the number 56 denotes a body. Further, reference number 57 denotes an air sealing unit formed in the body 56 and including the semiconductor light source 51 and the optical coupling unit 52, the number 58 denotes the optical fiber, and the number 59 denotes the optical connector to perform the butting contact between the optical fiber of the butting contact unit 54 and the optical fiber 58. Still further, reference number 60 denotes an electronic circuit for driving the semiconductor light source 51.

The semiconductor light source 51 and the optical coupling unit 52 are arranged on the same substrate 53. Further, the semiconductor light source 51, the optical coupling unit 52, the substrate 53 and the butting contact unit 54 are contained in the body 56 so as to form the air-sealed unit 57.

The adapter 55 having a hollow portion is provided to the body 56. When the optical connector 59, which includes the optical fiber 58 therein, is inserted to the adapter 55 so that the end surface of the butting contact unit 54 directly contacts with the end surface of the optical connector 59. In this case, the optical connector 59 contains the end of the optical fiber 58 therein, and the end surface of the optical connector 59 is polished (ground) with the end of the optical fiber 58.

The output of the semiconductor light source 51 is transmitted to the end surface of the butting contact unit 54 through the optical coupling unit 52 and the optical fiber contained in the butting contact unit 54. The end surface of the butting contact unit 54 is also polished with the optical fiber so as to adapt to the end surface of the optical connector 59. Both end surfaces of the butting contact unit 54 and the optical connector 59 are slanted so that it is possible to precisely contact both optical fibers.

When the optical connector 59 is inserted to the adapter 55, the end surface of the optical connector 59 is butted to the end surface of the butting contact unit 54 so that the optical fiber in the butting contact unit 54 can be directly connected to the optical fiber 58 in the optical connector 59. As a result, the output of the semiconductor light source 51 can be transmitted to the optical fiber 58.

Further, in FIG. 11B, the electronic circuit 60 is provided on an elongated portion of the substrate 53, and contained in the body 56.

The optical coupling between the semiconductor light source 51 and the optical coupling unit 52 may be realized by using a lens instead of the optical fiber. In this case, although it is not necessary to provide the air-sealed unit, it is very difficult to arrange and adjust the lens between the semiconductor light source 51 and the optical coupling unit 52. On the other hand, in the present invention, as explained above, the optical coupling between the semiconductor light source 51 and the optical coupling unit 52 is realized by using the optical fiber and the air-sealed unit 57 is provided for realizing the coupling using the optical fiber.

In general, although it is very difficult to realize the air-seal, the optical transmission module according to the present invention overcomes the difficulty of the air-seal by directly connecting between the semiconductor light source 51 and the optical coupling unit 52 using the optical fiber, and by directly coupling between the butting contact unit 54 and the optical connector 59 using the optical fiber.

Further, regarding the number of channels of the semiconductor light source 51, by providing a plurality of semiconductor light sources of FIG. 10 in parallel, it is possible to easily provide an optical transmission module for parallel optical transmission.

As explained above, according to the semiconductor light source of the present invention, it is possible to realize the power source having the positive polarity and the low voltage. Further, it is possible to provide the semiconductor light source for the optical transmitter enabling high speed modulation, and to provide the optical transmission module using the above semiconductor light source.

Still further, according to the present invention, it is possible to cheaply provide a semiconductor light source for an optical transmitter and an optical transmission module which are very useful for high speed data transmission in short distance optical communication between, as examples, optical terminals, optical exchangers, and computers.

I claim:

1. A light source device for an optical transmitter, comprising:

a two-electrode semiconductor laser provided on an n-type substrate and producing an optical output such that turning the semiconductor laser on starts laser oscillation and turning the semiconductor laser off stops laser oscillation;

an insulating substrate provided corresponding to the semiconductor laser, the insulating substrate having direct current (DC) and alternating current (AC) signal supply pads and DC and AC signal transmission lines provided thereon;

at least one DC supply means;

at least one AC supply means;

a DC signal source connected to the DC supply means to supply a drive signal thereto, the DC signal source having a DC signal supply electrode directly coupled to the DC signal supply pad through the DC signal transmission line; and an AC signal source connected to the AC supply means to supply a control signal thereto, the control signal controlling turning the optical output of the semiconductor laser on/off, the control signal having the same electric polarity as the drive signal from the DC signal source, the n-type substrate being set to a common potential with a power source for the DC/AC signal sources, with the polarity of the power source for the DC/AC signal sources being positive for the common potential, the AC signal source having an AC signal supply electrode positioned opposite to the DC signal supply electrode on an optical axis, the AC signal supply electrode being directly coupled to the AC signal supply pad through the AC signal transmission line.

* * * * *